(12) United States Patent
Chae et al.

(10) Patent No.: US 11,769,711 B2
(45) Date of Patent: Sep. 26, 2023

(54) SEMICONDUCTOR DEVICE INCLUDING A THROUGH SILICON VIA STRUCTURE AND METHOD OF FABRICATING THE SAME

(71) Applicant: SK hynix Inc., Icheon-si (KR)

(72) Inventors: Jung Yong Chae, Icheon-si (KR); Jin Hee Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 79 days.

(21) Appl. No.: 17/219,336

(22) Filed: Mar. 31, 2021

(65) Prior Publication Data

US 2022/0199493 A1    Jun. 23, 2022

(30) Foreign Application Priority Data

Dec. 21, 2020  (KR) .......................... 10-2020-0179951

(51) Int. Cl.
*H01L 23/48* (2006.01)
*H01L 21/768* (2006.01)
*H01L 23/522* (2006.01)

(52) U.S. Cl.
CPC ...... *H01L 23/481* (2013.01); *H01L 21/76831* (2013.01); *H01L 21/76898* (2013.01); *H01L 23/5226* (2013.01)

(58) Field of Classification Search
CPC ....... H01L 23/00; H01L 23/48; H01L 23/481; H01L 23/522; H01L 23/5226; H01L 23/538; H01L 23/5384; H01L 23/5386; H01L 21/768; H01L 21/76831; H01L 21/76841; H01L 21/76898; H01L 25/065; H01L 25/0657; H01L 24/05; H01L 29/7831; H01L 29/7832; H01L 29/7813; H01L 29/7825; H01L 29/4236; H01L 29/42352; H01L 29/42336; H01L 29/66734; H01L 29/66613; H01L 29/66628; H01L 2225/06544
USPC ........................................................ 257/774
See application file for complete search history.

(56) References Cited

U.S. PATENT DOCUMENTS

| | | | |
|---|---|---|---|
| 6,903,007 B1 * | 6/2005 | Foote ................ | H01L 21/76802 257/E21.59 |
| 2003/0203656 A1 * | 10/2003 | Kasahara .......... | H01L 29/66757 257/E29.279 |
| 2019/0312100 A1 * | 10/2019 | Bas ................... | H01L 27/11582 |

FOREIGN PATENT DOCUMENTS

| | | |
|---|---|---|
| KR | 10-2015-0088633 | 8/2015 |
| KR | 10-2017-0017170 | 2/2017 |
| KR | 10-2017-0023643 | 3/2017 |

* cited by examiner

*Primary Examiner* — Chuong A Luu
(74) *Attorney, Agent, or Firm* — Perkins Coie LLP

(57) ABSTRACT

A semiconductor device may include a via hole, a first electrode, a second electrode and a first protecting insulation layer. The via hole may be formed to penetrate a substrate. The first electrode may include an electrode segment formed on a surface of the via hole. The second electrode may be formed on the first electrode along the surface of the via hole. The second electrode may include two ends that are positioned below a surface of the substrate. The first protecting insulation layer may be formed on the second electrode along the surface of the via hole. The first protecting insulation layer may include both ends that upwardly protrude from the both ends of the second electrode.

19 Claims, 7 Drawing Sheets

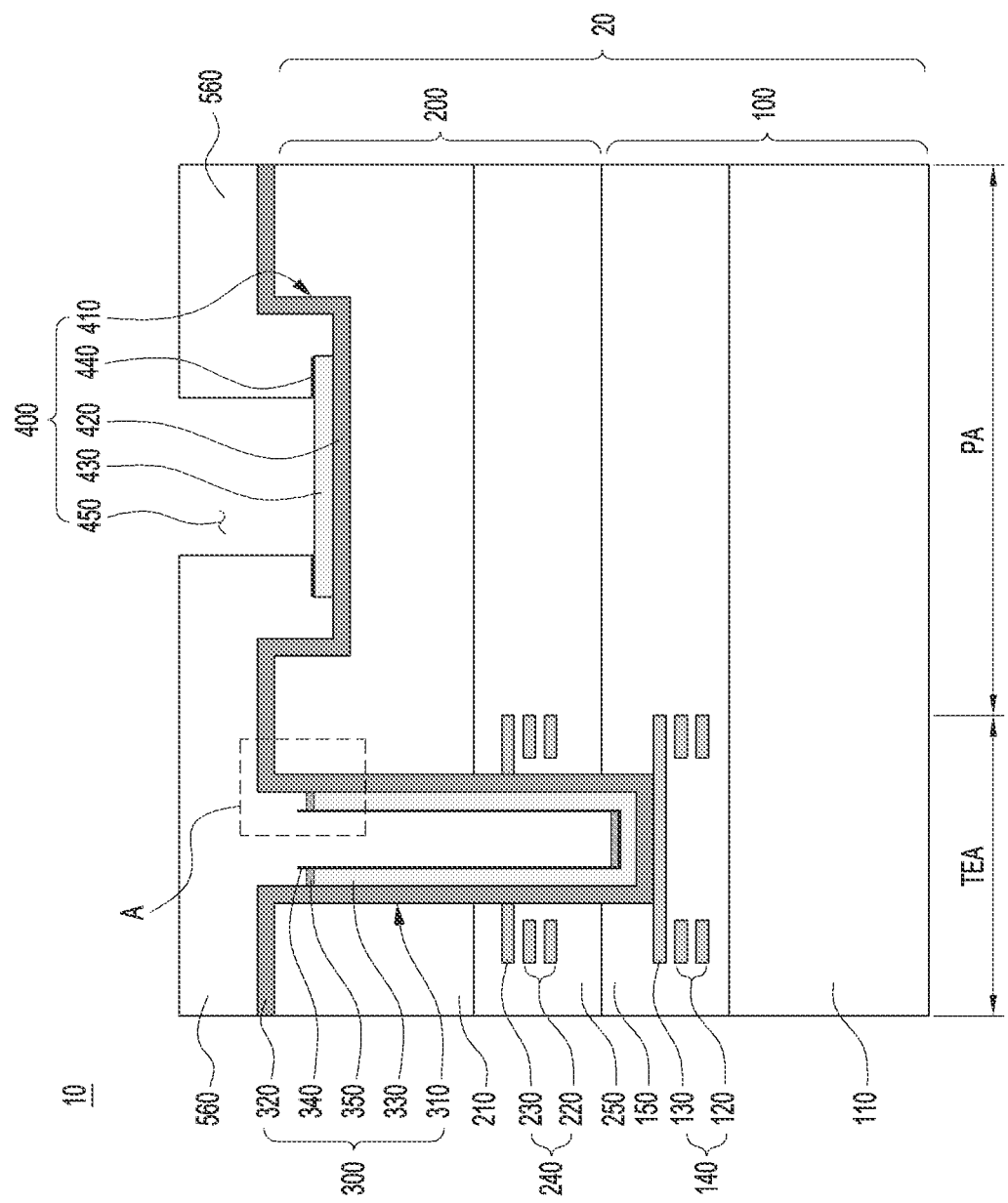

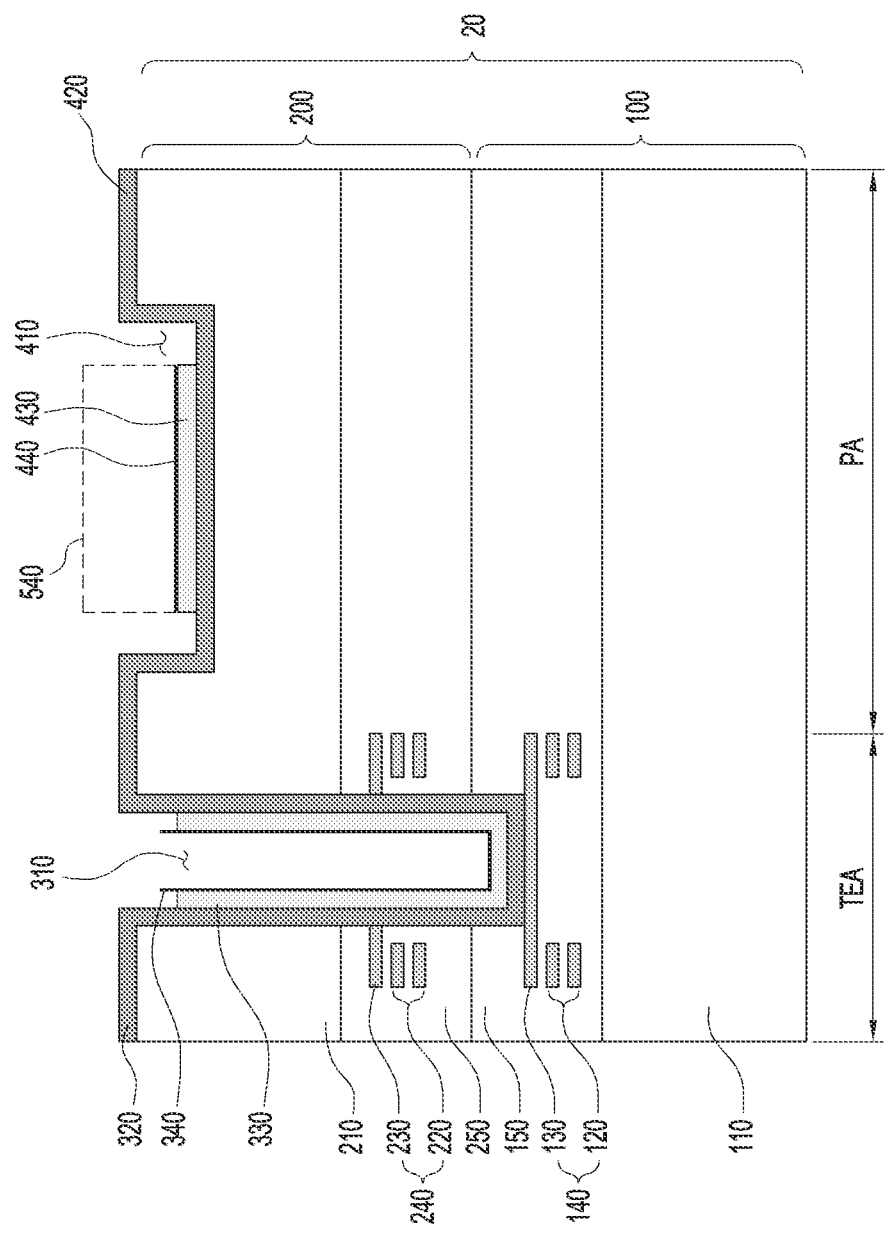

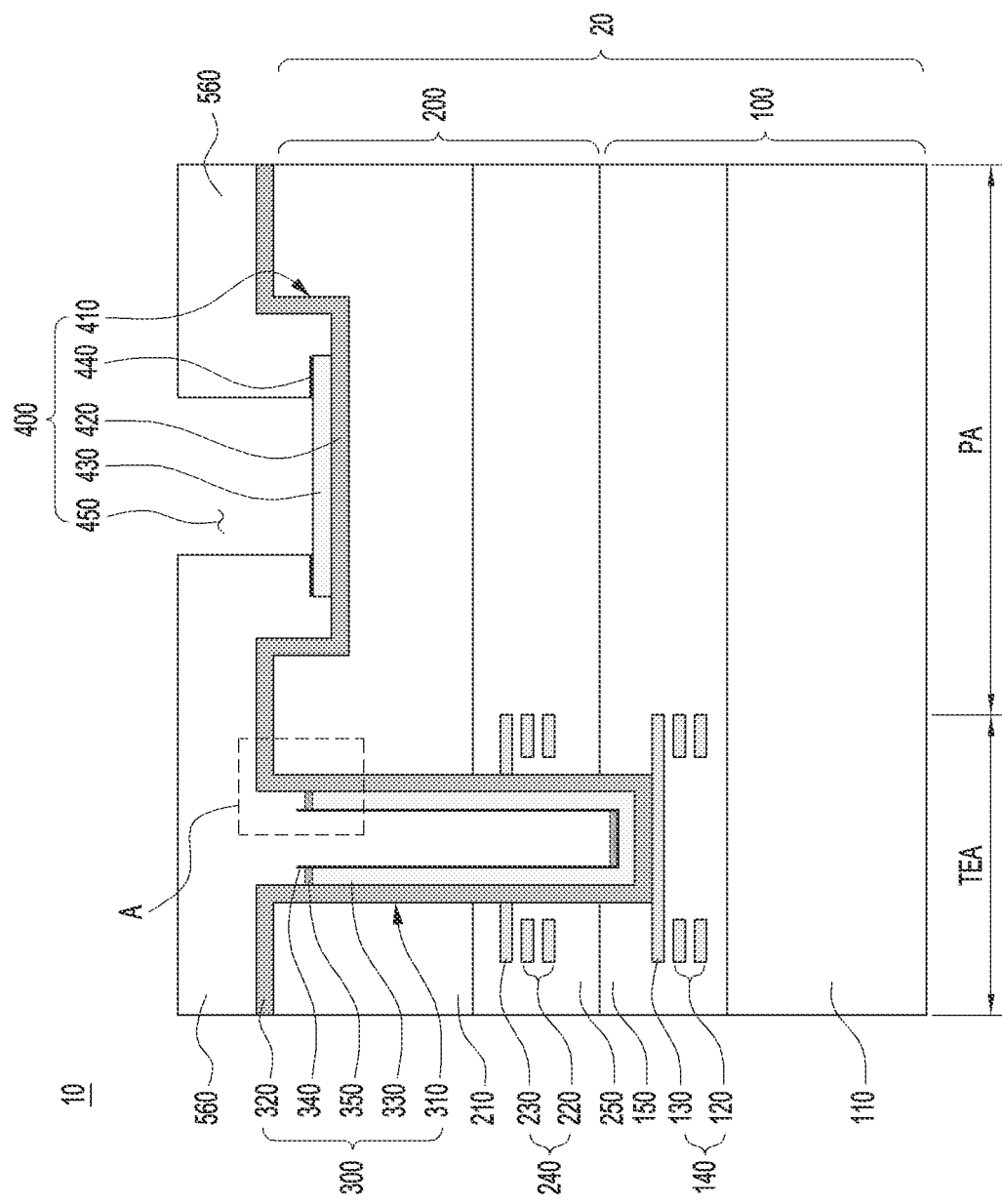

SEMICONDUCTOR DEVICE INCLUDING A THROUGH SILICON VIA STRUCTURE AND METHOD OF FABRICATING THE SAME

CROSS-REFERENCES TO RELATED APPLICATION

This patent document claims priority under 35 U.S.C. § 119(a) to Korean application number 10-2020-0179951, filed on Dec. 21, 2020, in the Korean Intellectual Property Office, which is incorporated herein by reference in its entirety.

TECHNICAL FIELD

The technology and implementations disclosed in this patent document generally relate to a semiconductor device, and more particularly, to a semiconductor device with a through silicon via (TSV) structure, and a method of manufacturing the semiconductor device.

BACKGROUND

As a three-dimensional (3D) package including a plurality of semiconductor chips in one semiconductor device is getting more developed, a through silicon via (TSV) technology configured to form an electrical connection vertically penetrating a substrate or a die becomes more important. In order to increase a performance and reliability of the 3D package, providing the TSV structure with stable operations characteristics and high reliability is required.

SUMMARY

Example embodiments of the disclosed technology provide a semiconductor device including an improved TSV structure.

Example embodiments of the disclosed technology also provide a method of manufacturing the above-mentioned semiconductor device.

In example embodiments of the disclosed technology, a semiconductor device may include a via hole, a first electrode, a second electrode and a first protecting insulation layer. The via hole may be formed to penetrate a substrate. The first electrode may include an electrode segment formed on a surface of the via hole. The second electrode may be formed on the first electrode along the surface of the via hole. The second electrode may include two ends that are positioned below a surface of the substrate. The first protecting insulation layer may be formed on the second electrode along the surface of the via hole. The first protecting insulation layer may include both ends that upwardly protrude from the both ends of the second electrode.

In example embodiments, the semiconductor device may further include a second protecting insulation layer and a capping layer. The second protecting insulation layer may be configured to cover the both ends of the second electrode exposed by the first electrode and the first protecting insulation layer. The capping layer may be configured to cover the substrate and fill the via hole.

In example embodiments of the disclosed technology, a semiconductor device may include a stack structure, a via hole, a first electrode, a second electrode and a first protecting insulation layer. The stack structure may include a lower structure and an upper structure. The lower structure may include a lower substrate, a lower insulating interlayer disposed on the lower substrate, and a lower circuit disposed in the lower insulating interlayer. The lower circuit may include a lower via pad. The upper structure may include an upper substrate, an upper insulating interlayer disposed on the upper substrate, and an upper circuit disposed in the upper insulating interlayer. The via hole may be formed at the stack structure to expose the lower via pad. The first electrode may be formed on a surface of the via hole. The second electrode may be formed on the first electrode along the surface of the via hole. The second electrode may include both ends positioned below a surface of the stack structure. The first protecting insulation layer may be formed on the second electrode along the surface of the via hole. The first protecting insulation layer may include both ends upwardly protruding from the both ends of the second electrode.

In example embodiments, the semiconductor device may further include a second protecting insulation layer and a capping layer. The second protecting insulation layer may be configured to cover the both ends of the second electrode exposed by the first electrode and the first protecting insulation layer. The capping layer may be configured to cover the stack structure and fill the via hole.

In example embodiments of the disclosed technology, according to a method of fabricating a semiconductor device, a substrate may be etched to form a via hole. A first electrode may be formed on a surface of the via hole. A conductive layer and an insulation layer may be formed on a surface of the substrate. The conductive layer and the insulation layer may be etched to form a second electrode on the first electrode and a first protecting insulation layer on the second electrode. The second electrode may be formed on the first electrode along the surface of the via hole. The first protecting insulation layer may be formed on the second electrode along the surface of the via hole. The second electrode may include both ends that may be positioned below a surface of the substrate. The first protecting insulation layer may include both ends that upwardly protrude from the both ends of the second electrode.

In example embodiments, the method may further include forming a second protecting insulation layer to cover the both ends of the second electrode exposed by the first electrode and the first protecting insulation layer, and forming a capping layer to cover the substrate and to fill the via hole.

According to example embodiments, the both ends of the second electrode may be positioned lower than the surface of the substrate. Further, the both ends of the first protecting insulation layer may be protruded from the both ends of the second electrode. Thus, an oxidation of the second electrode caused by moisture infiltration may be prevented.

Further, because the both ends of the first protecting insulation layer may be protruded from the both ends of the second electrode, the both ends of the second electrode may have a flat surface parallel to the surface of the substrate. Thus, the second protecting insulation layer configured to cover the second electrode may be readily formed together with the first protecting insulation layer. As a result, the oxidation of the second electrode caused by the moisture infiltration may be effectively prevented.

Furthermore, the first protecting insulation layer and the second protecting insulation layer may include a non-metal based insulation layer. Thus, although the moisture may infiltrate into the second electrode, a galvanic corrosion may not be generated between the second electrode and the first protecting insulation layer, and between the second electrode and the second protecting insulation layer.

As a result, the oxidation and the corrosion of the second electrode caused by the moisture infiltration may be effectively prevented so that the semiconductor device including the TSV structure may have improved reliability.

BRIEF DESCRIPTION OF THE DRAWINGS

The above and another aspects, features and advantages of the subject matter of the present disclosure will be more clearly understood from the following detailed description taken in conjunction with the accompanying drawings.

FIG. 1A is a cross-sectional view illustrating an example of a semiconductor device in accordance with an implementation of the disclosed technology.

FIGS. 2A to 2E are cross-sectional views illustrating an example of a method of fabricating a semiconductor device in accordance with an implementation of the disclosed technology.

DETAILED DESCRIPTION

Various embodiments of the disclosed technology will be described in greater detail with reference to the accompanying drawings.

Hereinafter, example embodiments may provide a semiconductor device including an electrically conductive path through a substrate such as a through-silicon vias (TSV) structure as an electrical connection to provide improved reliability and a method of fabricating the semiconductor device. The TSV structure having the improved reliability may be capable of preventing an oxidation caused a moisture infiltration. When an electrode of the TSV structure may be partially protruded from a via hole, which can be caused by a process, a moisture may easily infiltrate into the protruded electrode. Although a capping layer may cover the TSV structure, such protrusion of the electrode of the TSV structure may decrease the reliability of the TSV structure. Thus, example embodiments may provide the semiconductor device including the TSV structure and the method of fabricating the semiconductor device that may be capable of preventing the above-mentioned problem.

Figure 1B:
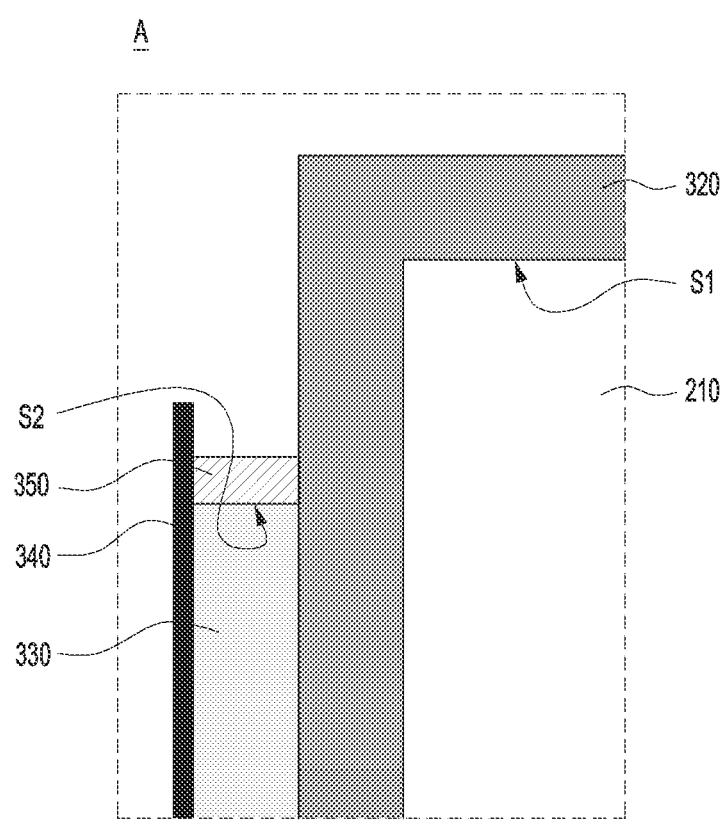
FIG. 1B is an enlarged view illustrating a portion "A" in FIG. 1A.

FIG. 1A is a cross-sectional view illustrating a semiconductor device in accordance with example embodiments, and FIG. 1B is an enlarged view illustrating a portion "A" in FIG. 1A.

Referring to FIGS. 1A and 1B, a semiconductor device 10 of example embodiments may include a stack structure 20. The stack structure 20 may include a lower structure 100, an upper structure 200 stacked on the lower structure 100 and a TSV structure 300 electrically connected between the lower structure 100 and the upper structure 200. The stack structure 20 may include a through electrode area (TEA) in which the TSV structure 300 may be positioned, and a pad area (PA) in which a pad structure 400 may be positioned.

The lower structure 100 in the stack structure 20 may include a lower substrate 110 and a lower circuit 140. The lower circuit 140 may be arranged in a lower insulating interlayer 150 on the lower substrate 110. The upper structure 200 may include an upper substrate 210 and an upper circuit 240. The upper circuit 240 may be arranged in an upper insulating interlayer 250 over or on the upper substrate 210. The upper structure 200 may be stacked over or on the lower structure 100 to form the stack structure 20. In the upper structure 200 and the lower structure 100 of the stack structure 20, the upper insulating interlayer 250 and the lower insulating interlayer 150 may be bonded to each other by contacting the upper insulating interlayer 250 with the lower insulating interlayer 150, not restricted within a specific manner. Alternatively, in the upper structure 200 and the lower structure 100 of the stack structure 20, the lower insulating interlayer 150 may make contact with the upper substrate 210 to bond the lower insulating interlayer 150 to the upper substrate 210.

The lower substrate 110 and the upper substrate 210 may include at least one of a bulk single crystalline silicon wafer, a silicon-on-insulator (SOI) wafer, a compound semiconductor wafer such as Si—Ge, a wafer including a silicon epitaxial layer, or others.

The lower circuit 140 may include a lower wiring 120 and a lower via pad 130. The lower via pad 130 may be positioned in the TEA. The lower via pad 130 may electrically make contact with a lower end of the TSV structure 300. The upper circuit 240 may include an upper wiring 220 and an upper via pad 230. The upper via pad 230 may be positioned in the TEA. The upper via pad 230 may electrically make contact with the TSV structure 300, not restricted within a specific connection structure. Alternatively, the upper via pad 230 may be spaced apart from the TSV structure 300 to be electrically isolated from the TSV structure 300.

The lower wiring 120, the lower via pad 130, the upper wiring 220 and the upper via pad 230 may include at least one of a metal such as tungsten, aluminum, copper, etc., a metal silicide such as tungsten silicide, titanium silicide, etc., a metal compound such as tungsten nitride, titanium nitride, etc., a doped silicon, or others.

The TSV structure 300 in the TEA may include a via hole 310, a first electrode 320, a second electrode 330, a first protecting insulation layer 340 and a second protecting insulation layer 350. The via hole 310 may be formed through the stack structure 20. As illustrated in the example in FIG. 1A, the via hole 310 penetrates through the upper structure 200 to reach into the lower structure 100 (which includes the lower circuit 140). The first electrode 320 may be formed to include an electrode segment formed inside the via hole 310 on a surface of the via hole 310 and to form an electrical connection which may, as in the example shown in FIG. 1A, to connect the pad structure 400 in the pad area PA and the lower circuit 140 in the lower structure 100. The second electrode 330 may be formed inside the via hole 310 and on the first electrode 320 along the surface of the via hole 310. The first protecting insulation layer 340 may be formed inside the via hole 310 and on the second electrode 330 along the surface of the via hole 310. The second protecting insulation layer 350 may be configured to cover the two ends of the second electrode 330 that are not covered by the first protecting insulation layer 340. In the example in FIG. 1A, both insulation layers 340 and 350 collectively cover the second electrode 330. The TSV structure 300 may further include a capping layer 560 formed on the stack structure 20 to fill the via hole 310. The capping layer 560 may include an insulation material.

The via hole 310 may be formed through the upper substrate 210, the upper via pad 230 and the upper insulating interlayer 250. The via hole 310 may be partially formed through the lower insulating interlayer 150 to expose the lower via pad 130. In example embodiments, the via hole 310 may include single hole pattern configured to expose the lower via pad 130. However, other implementations are possible. For example, the via hole 310 may include a plurality of hole patterns configured to expose the lower via pad 130.

The first electrode 320 may be formed along the surface of the via hole 310. The first electrode 320 may have a uniform thickness. Thus, the first electrode 320 having the uniform thickness may be formed on a bottom surface and a side surface of the via hole 310. Both ends of the first electrode 320 may be extended to the upper substrate 210. The first electrode 320 may be electrically connected between the TSV structure 300 and the pad structure 400. The first electrode 320 may include at least one of a metal, a metal silicide or a metal compound. For example, the first electrode 320 may include tungsten.

The second electrode 330 may be formed on the first electrode 320 in the via hole 310 along the surface of the via hole 310. Thus, the second electrode 330 may have a cylindrical shape. The second electrode 330 may have a uniform thickness. Alternatively, a portion of the second electrode 330 on the bottom surface of the via hole 310 may have a thickness thicker than a thickness of a portion of the second electrode 330 on an upper portion of the side surface of the via hole 310. In example embodiments, the second electrode 330 having the uniform thickness may be formed along the surface of the via hole 310.

In order to prevent the oxidation caused by the moisture infiltration, the both ends of the second electrode 330 may be positioned lower than a surface of the stack structure 20, i.e., the surface S1 of the upper substrate 210. Since the first protecting insulation layer 340 has both ends protruding from the both ends of the second electrode 330, the both ends of the second electrode 330 may have a flat surface S2 parallel to the surface S1 of the upper substrate 210. The second electrode 320 may include at least one of a metal, a metal silicide or a metal compound. For example, the second electrode 330 may include aluminum.

The first protecting insulation layer 340 may function as to protect the second electrode 330. Further, the first protecting insulation layer 340 may function as to prevent the oxidation of the second electrode 330 caused by the moisture infiltration. The first protecting insulation layer 340 having a uniform thickness may be formed on the second electrode 330 in the via hole 310 along the surface of the via hole 310. The first protecting insulation layer 340 having the uniform thickness on the second electrode 330 may be formed over the bottom surface and the side surface of the via hole 310. Thus, the first protecting insulation layer 340 may have a cylindrical shape. Further, in order to effectively prevent the oxidation of the second electrode 330 caused by the moisture infiltration, the first protecting insulation layer 340 may include both ends protruded from the both ends of the second electrode 330. Therefore, the both ends of the first protecting insulation layer 340 may be protruded from the both ends of the second electrode 330 to effectively block a path of the moisture infiltration, thereby effectively preventing the oxidation of the second electrode 330.

The both ends of the first protecting insulation layer 340 may be protruded from the both ends of the second electrode 330 so that the both ends of the second electrode 330 may have the flat surface S2 parallel to the surface S1 of the upper substrate 210. This may be illustrated in detail with reference to FIGS. 2C and 2D.

Further, in order to prevent a galvanic corrosion caused by a difference between work functions of the second electrode 330 and the first protecting insulation layer 340, the first protecting insulation layer 340 may include a nonmetal-based insulation material. When a protecting layer including titanium nitride may be used for protecting the second electrode 330 in the TSV structure 300, a high difference between the work functions of titanium and aluminum may exist. Thus, the protecting layer including the titanium nitride may cause the galvanic corrosion as well as the oxidation caused by the moisture infiltration. However, the first protecting insulation layer 340 including the non-metal insulation layer may protect the second electrode 330 to prevent the galvanic corrosion.

The first protecting insulation layer 340 may include oxide, nitride, or oxynitride. The first protecting insulation layer 340 may function as an anti-reflective layer for preventing a misalignment between processes. Thus, the non-metal-based insulation material of the first protecting insulation layer 340 may have a reflectivity of about 30%, particularly, about 25% to about 35% in a photolithograph process using an I-line (365 nm). For example, the first protecting insulation layer 340 may include silicon oxynitride (SiON). When the first protecting insulation layer 340 may include the silicon oxynitride, the first protecting insulation layer 340 may have a thickness of about 330 Å to about 400 Å, or 1060 Å to about 1470 Å so as to meet the above-mentioned reflectivity.

The second protecting insulation layer 350 may seal the second electrode 330 together with the first protecting insulation layer 340 to prevent the oxidation and corrosion caused by the moisture infiltration. Thus, the second protecting insulation layer 350 may be configured to cover the both ends having the flat surface S2 of the second electrode 330. The second protecting insulation layer 350 may include a nonmetal insulation material. In order to easily form the second protecting insulation layer 350 configured to cover the both ends having the flat surface S2 of the second electrode 330 by the first protecting insulation layer 340, the second protecting insulation layer 350 may include a material having low step coverage. For example, the second protecting insulation layer 350 may include silicon nitride (SiN).

The pad structure 400 in the pad area PA may include a trench 410, a first pad electrode 420, a second pad electrode 430, a capping layer 560, a pad protection layer 440 and a pad opening 450. The trench 410 may be formed at the stack structure 20. The first pad electrode 420 may be formed on a surface of the trench 410. The second pad electrode 430 may be formed on the first pad electrode 420. The capping layer 560 may be formed on the stack structure 20 to fill the trench 410. The pad protection layer 440 may be formed between the capping layer 560 and the second pad electrode 430. The pad opening 450 may be formed at the capping layer 560 to expose the second pad electrode 430. The capping layer 560 may include an insulation material.

The trench 410 may function as to prevent a generation of a step at a stacked surface of the pad structure 400, i.e., the surface S1 of the upper substrate 210. The trench 410 may be formed by partially etching the upper substrate 210.

The first pad electrode 420 having a uniform thickness may be formed along the surface of the trench 410. That is, the first pad electrode 420 having the uniform thickness may be formed on a bottom surface and a side surface of the trench 410. The first pad electrode 420 may include both ends extended to the upper substrate 210. The other end of the first pad electrode 420 may be extended to the TEA. The first pad electrode 420 may include a metal, a metal silicide or a metal compound. The first pad electrode 420 may be formed together with the first electrode 320 so that the first pad electrode 420 may include a material substantially the same as that of the first electrode 320. For example, the first pad electrode 420 may include tungsten.

The second pad electrode 430 having a uniform thickness may be formed on the first pad electrode 420. That is, the second pad electrode 430 may have a plate shape having the uniform thickness over the bottom surface of the trench 410.

The second pad electrode 430 may include a metal, a metal silicide or a metal compound. The second pad electrode 430 may be formed together with the second electrode 330 so that the second pad electrode 430 may include a material substantially the same as that of the second electrode 330. For example, the second pad electrode 430 may include aluminum.

The pad protection layer 440 may protect the second pad electrode 430 between the processes. The pad protection layer 440 may be formed together with the first protecting insulation layer 340 so that the pad protecting layer 440 may include a material substantially the same as that of the first protecting insulation layer 340. The pad protection layer 440 may include oxide, nitride or oxynitride. For example, the pad protection layer 440 may include silicon oxynitride (SiON).

According to example embodiments, the both ends of the second electrode 330 may be lower than the surface of the stack structure 20, i.e., the surface S1 of the upper substrate 210. Further, the both ends of the first protecting insulation layer 340 may be upwardly protruded from the both ends of the second electrode 330. Thus, the oxidation of the second electrode 330 caused by the moisture infiltration may be prevented.

Because the both ends of the first protecting insulation layer 340 may be protruded from the both ends of the second electrode 330, the both ends of the second electrode 330 may have the flat surface S2 parallel to the surface S1 of the upper substrate 210. Thus, the second protecting insulation layer 350 configured to cover the second electrode 330 may be readily formed together with the first protecting insulation layer 340. As a result, the oxidation of the second electrode 330 caused by the moisture infiltration may be effectively prevented.

Furthermore, the first protecting insulation layer 340 and the second protecting insulation layer 350 may include the non-metal based insulation layer. Thus, although the moisture may infiltrate into the second electrode 330, the galvanic corrosion may not be generated between the second electrode 330 and the first protecting insulation layer 340, and between the second electrode 330 and the second protecting insulation layer 350.

As a result, the oxidation and the corrosion of the second electrode 330 caused by the moisture infiltration may be effectively prevented so that the semiconductor device including the TSV structure 300 may have improved reliability.

FIGS. 2A to 2E are cross-sectional views illustrating an example of a method of fabricating a semiconductor device in accordance with example embodiments.

Figure 2A:
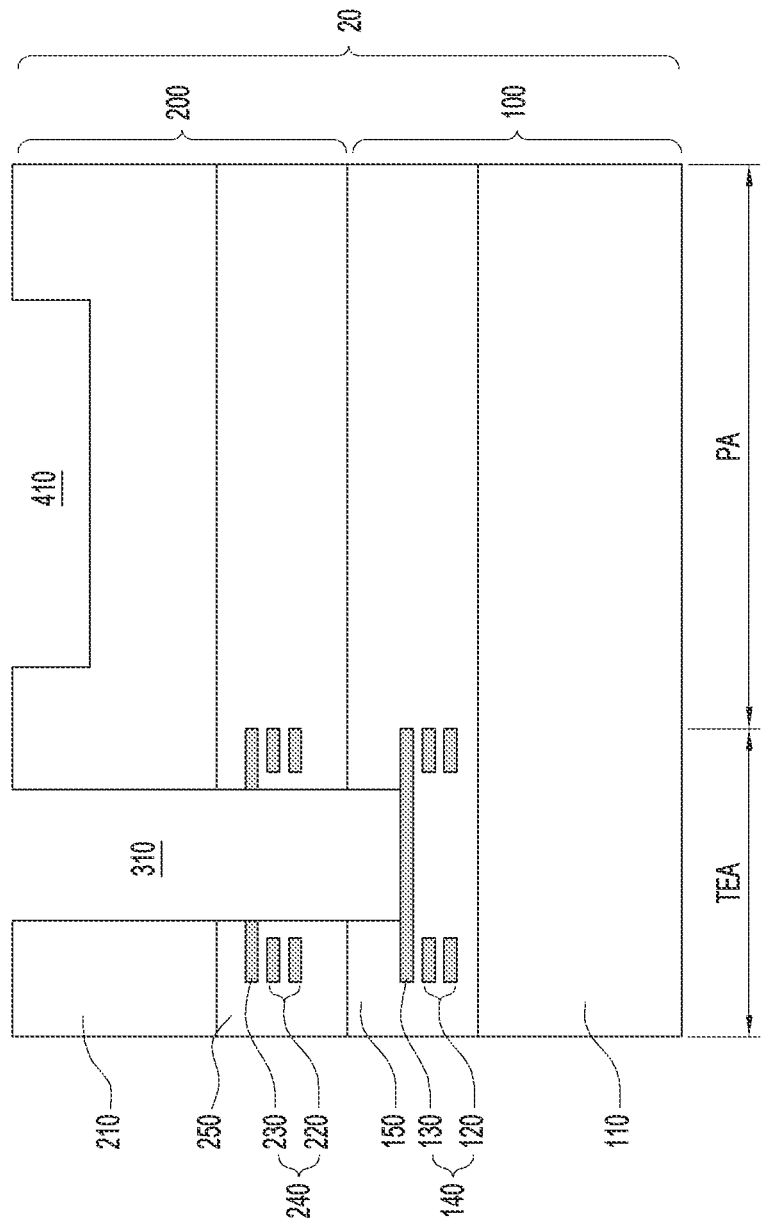

Referring to FIG. 2A, the stack structure 20 including the lower structure 100 and the upper structure 200 may be prepared. The stack structure 20 may include the TEA and the PA. The TEA may correspond to an area where the TSV structure 300 in FIG. 1A may be to be formed. The PA may correspond to an area where the pad structure 400 in FIG. 1A may be to be formed.

The lower structure 100 in the stack structure 20 may include the lower substrate 110 and the lower circuit 140. The lower circuit 140 may be arranged in the lower insulating interlayer 150 on the lower substrate 110. The lower circuit 140 may include the lower wiring 120 and the lower via pad 130 in the TEA. The upper structure 200 may include the upper substrate 210 and the upper circuit 240. The upper circuit 240 may be arranged in the upper insulating interlayer 250 on the upper substrate 210. The upper circuit 240 may include the upper wiring 220 and the upper via pad 230 in the TEA. The stack structure 20 may be formed by bonding the lower structure 100 to the upper structure 200 while the upper insulating interlayer 250 and the lower insulating interlayer 150 face or contact to each other.

The lower substrate 110 and the upper substrate 210 may include at least one of a bulk single crystalline silicon wafer, a silicon-on-insulator (SOI) wafer, a compound semiconductor wafer such as Si—Ge, a wafer including a silicon epitaxial layer, or others. The lower wiring 120, the lower via pad 130, the upper wiring 220 and the upper via pad 230 may include a metal such as tungsten, aluminum, copper, etc., a metal silicide such as tungsten silicide, titanium silicide, etc., a metal compound such as tungsten nitride, titanium nitride, etc., a doped silicon, or others.

The via hole 310 may be formed at the TEA. The via hole 310 may be formed by, for example, etching the upper substrate 210, the upper insulating interlayer 250 and the lower insulation interlayer 150 using a mask pattern on the upper substrate 210 as an etch mask until the lower via pad 130 may be exposed. The via hole 310 may be configured to expose the upper via pad 230. Alternatively, the via hole 310 may be formed through the upper via pad 230.

The trench 410 may be formed at the pad area PA. The trench 410 may provide a space for the pad structure 400 as shown in in FIG. 1A. Further, the trench 410 may prevent the generation of the step at the surface of the stack structure 20 caused by the pad structure 400. The upper substrate 210 may be partially etched to form the trench 410. In some implementations, the etching process for forming the via hole 310 and the trench 410 may include an anisotropic dry etch process.

Figure 2B:
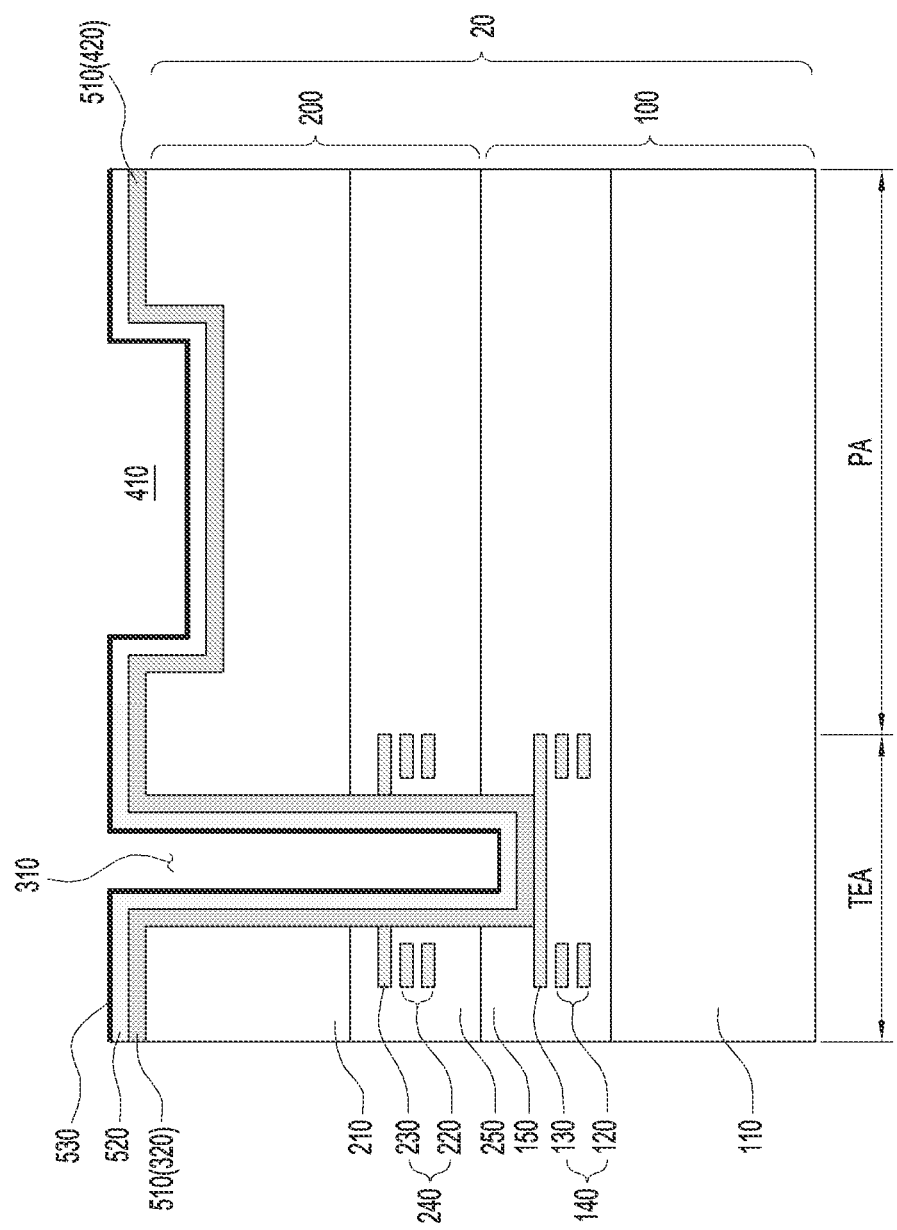

Referring to FIG. 2B, a first conductive layer 510 having a uniform thickness may be formed on the surface of the stack structure 20 with the via hole 310 and the trench 410. The first conductive layer 510 may have a thickness that may not fully fill the via hole 310 and the trench 410. The first conductive layer 510 may include a metal, a metal silicide or a metal compound. For example, the first conductive layer 510 may include tungsten.

Although not depicted in drawings, the first conductive layer 510 may be selectively etched to form the first electrode 320 in the TEA and the first pad electrode 420 in the PA. The first electrode 320 may be formed along the surface of the via hole 310. The first electrode 320 may be partially extended to the upper surface of the upper substrate 210. Thus, the first electrode 320 may be configured to cover the bottom surface and the side surface of the via hole 310 and to partially cover the upper substrate 210 adjacent to the via hole 310. The first pad electrode 420 may be formed along the surface of the trench 410. The first pad electrode 420 may be partially extended to the upper surface of the upper substrate 210. Thus, the first pad electrode 420 may be configured to cover the bottom surface and the side surface of the trench 410 and to partially cover the upper substrate 210 adjacent to the trench 410. The first electrode 320 and the first pad electrode 420 that are extended to the upper surface of the upper substrate 210 may be electrically connected with each other.

A second conductive layer 520 may be formed on the surface of the stack structure 20 with the via hole 310, the first electrode 320, the trench 410 and the first pad electrode 420. The second conductive layer 520 may have a thickness that may not fully fill the via hole 310 and the trench 410. The second conductive layer 520 may have a uniform thickness along the surface of the stack structure 20. Alternatively, a portion of the second conductive layer 520 on the bottom surfaces of the via hole 310 and the trench 410 may have a thickness greater than a thickness of a portion of the second conductive layer 520 on the side surfaces of the via hole 310 and the trench 410. To configure the second conductive layer 520 to have a greater thickness on bottom surfaces of the via hole 310 and the trench 410, a deposition condition can be adjusted by, for example, controlling a pressure such that a vertical deposition rate is greater than a horizontal deposition rate. The second conductive layer 520 may include at least one of a metal, a metal silicide, or a metal compound. For example, the second conductive layer 520 may include aluminum.

An insulation layer 530 having a uniform thickness may be formed on the second conductive layer 520 along the surface of the stack structure 20 with the via hole 310 and the trench 410. The insulation layer 530 may have a thickness that may not fully fill the via hole 310 and the trench 410. The insulation layer 530 may include a material having an etching selectivity with respect to a material of the second conductive layer 520. Particularly, the insulation layer 530 may include an insulation material having an etching selectivity with respect to an etchant for etching the second conductive layer 520. The insulation layer 530 may include at least one of oxide, nitride, or oxynitride. For example, the insulation layer 530 may include a nonmetal-based insulation material.

The insulation layer 530 may act as the anti-reflective layer in forming a pad mask 540 for a second pad electrode in FIG. 2C. In some implementations, in a photolithograph process using an I-line (365 nm), the insulation layer 530 may have a material with a reflectivity in a range about 25% to about 35%, for example, about 30%.

Thus, the insulation layer 530 may include silicon oxynitride (SiON). When the insulation layer 530 may include the silicon oxynitride, the first protecting insulation layer 340 may have a thickness of about 330 Å to about 400 Å, or 1060 Å to about 1470 Å so as to meet the above-mentioned reflectivity.

Referring to FIG. 2C, the pad mask 540 may be formed on the insulation layer 530 in the PA. The insulation layer 530 and the second conductive layer 520 may be etched using the pad mask 540 as an etch barrier until the first conductive layer 510 may be exposed. The etch process may be performed with the TEA being exposed. The etch process may include an anisotropic dry etch process. For example, an etch-back process may be performed in the TEA.

Therefore, the second pad electrode 430 and the pad protection layer 440 may be formed in the PA. Further, the second electrode 330 and the first protecting insulation layer 340 may be formed in the TEA. Because the etch process may be performed with the TEA being fully exposed, the second electrode 330 and the first protecting insulation layer 340 may have cylindrical shapes. The both ends of the second electrode 330 may be positioned below the surface of the upper substrate 210. In some implementations, the first protecting insulation layer 340 may include the material having a etching selectivity with respect to the material of the second conductive layer 520, for example, SiON. Thus, the both ends of the first protecting insulation layer 340 may be upwardly protruded from the both ends of the second electrode 330. Thus, the both ends of the second electrode 330 may have the flat surface S2 in FIG. 1B parallel to the surface of the upper substrate 210.

In contrast, when the first protecting insulation layer 340 may not have the etch selectivity with respect to the second conductive layer 520, the both ends of the first protecting insulation layer 340 may not be upwardly protruded from the both ends of the second electrode 330 so that the first protecting insulation layer 340 without the upward protrusion may not effectively block the path of the moisture infiltration. Further, in this case, the both ends of the second electrode 330 may have sharp ends so that the second protecting insulation layer 350 may not fully cover the both ends of the second electrode 330 by following processes.

The pad mask 540 may then be removed by an ashing process and/or a stripping process.

Figure 2D:
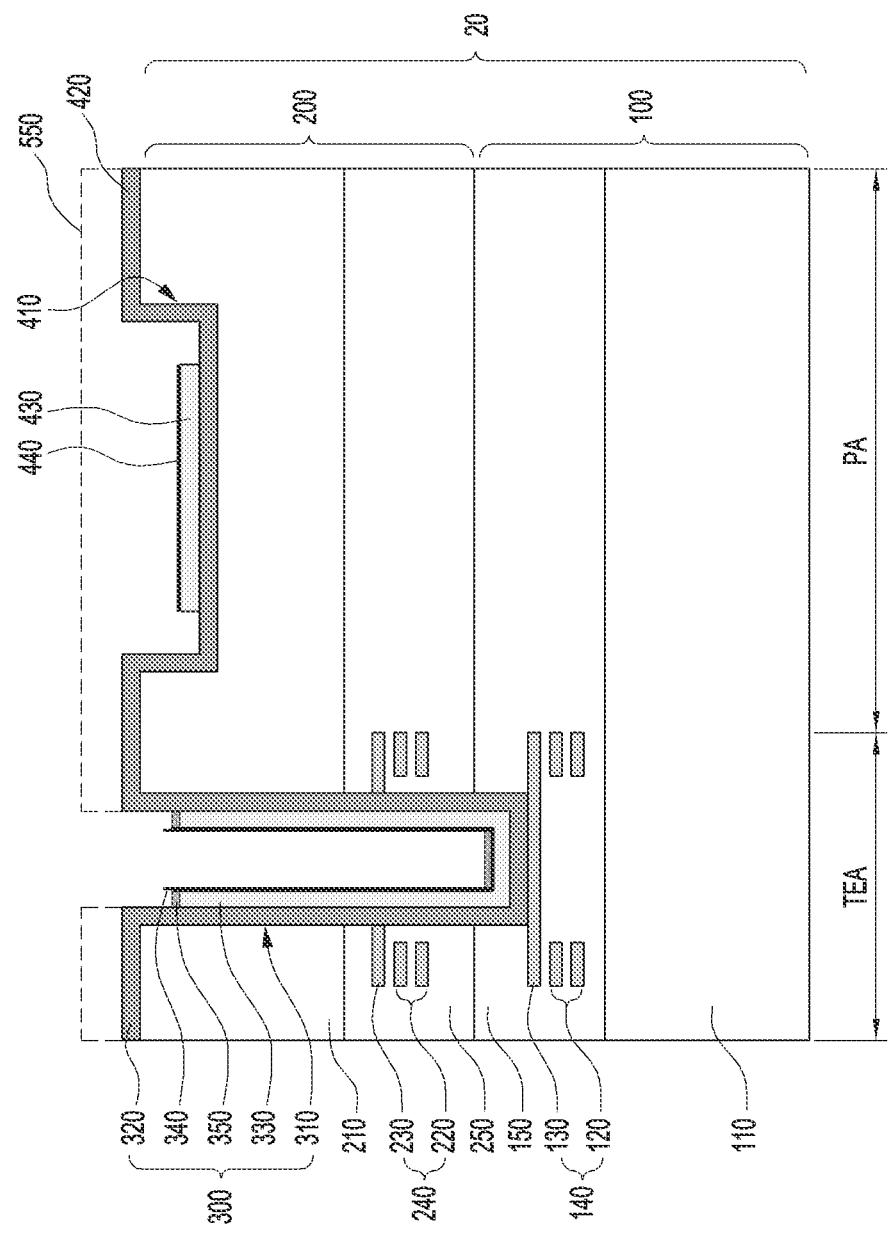

Referring to FIG. 2D, a via mask 550 may be formed on the stack structure 20. The via mask may have an opening configured to expose the via hole 310. The second protecting insulation layer 350 may be formed on the surfaces S2 of the both ends of the second electrode 330. In order to selectively form the second protecting insulation layer 350 on the surfaces of the both ends of the second electrode 330, the second protecting insulation layer 350 may be formed under deposition conditions including low step coverage characteristics. For example, the second protecting insulation layer 350 may be formed by setting a vertical deposition rate greater than a horizontal deposition rate. For example, the vertical deposition rate can be set to be greater than that of the horizontal deposition rate by controlling the pressure.

The second protecting insulation layer 350 may include at least one of oxide, nitride, or oxynitride. For example, the second protecting insulation layer 350 may include a non-metal-based insulation material. In order to selectively form the second protecting insulation layer 350 on the both ends of the second electrode 330, the second protecting insulation layer 350 may include an insulation material having low step coverage characteristics. For example, the second protecting insulation layer 350 may include silicon nitride.

Because the both ends of the second electrode 330 may have the flat surface S2 in FIG. 1B parallel to the surface S1 of the upper substrate 210 in FIG. 1B, the second protecting insulation layer 350 can fully cover the both ends of the second electrode 330. Thus, the second electrode 330 may be fully sealed by the first protecting insulation layer 340 and the second protecting insulation layer 350. As a result, the oxidation of the second electrode 330 caused by the moisture infiltration may be effectively prevented.

The via mask 550 may then be removed by an ashing process and/or a stripping process. By removing the via mask 550, the second protecting insulation layer 350 on an unnecessary region may also be removed.

Referring to FIG. 2E, the capping layer 560 may be formed on the surface of the stack structure 20. The capping layer 560 may include an insulation material.

The capping layer 560 and the pad protection layer 440 may be selectively etched to form the pad opening 450 configured to expose the second pad electrode 430.

Therefore, the TSV structure 300 may be completed. The TSV structure 300 may include the via hole 310, the first electrode 320, the second electrode 330, the first protecting insulation layer 340 and the second protecting insulation layer 350. The via hole 310 may be formed at the stack structure 20. The first electrode 320 may be formed on the surface of the via hole 310. The second electrode 330 may be formed on the first electrode 320 along the surface of the via hole 310. The first protecting insulation layer 340 may be formed on the second electrode 330 along the surface of the via hole 310. The second protecting insulation layer 350 may be configured to cover the both ends of the second electrode 330.

Further, the pad structure 400 may also be completed. The pad structure 400 may include the trench 410, the first pad electrode 420, the second pad electrode 430, the capping layer 560, the pad protecting layer 440 and the pad opening 450. The trench 410 may be formed at the stack structure 20. The first pad electrode 420 may be formed on the surface of the trench 410. The second pad electrode 430 may be formed on the first pad electrode 420. The capping layer 560 may be configured to cover the stack structure 20 and to fill the trench 410. The pad protection layer 440 may be formed between the capping layer 560 and the second pad electrode 430. The pad opening 450 may be formed at the capping layer 560 to expose the second pad electrode 430.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A semiconductor device, comprising:
a via hole formed to penetrate a substrate;
a first electrode including an electrode segment formed on a surface of the via hole;
a second electrode formed on the first electrode along the surface of the via hole, the second electrode including two ends that are positioned below a surface of the substrate, the second electrode being in contact with the first electrode; and
a first protecting insulation layer formed on the second electrode along the surface of the via hole, the first protecting insulation layer including two ends that upwardly protrude from the two ends of the second electrode.

2. The semiconductor device of claim 1, further comprising a second protecting insulation layer configured to cover the two ends of the second electrode exposed by the first electrode and the first protecting insulation layer.

3. The semiconductor device of claim 2, wherein the first protecting insulation layer and the second protecting insulation layer comprise different non-metal insulation materials.

4. The semiconductor device of claim 1, further comprising a capping layer configured to cover the substrate and fill the via hole.

5. The semiconductor device of claim 4, wherein the capping layer includes an insulation material.

6. The semiconductor device of claim 1, wherein the two ends of the second electrode exposed by the first electrode and the first protecting insulation layer have a flat surface parallel to the surface of the substrate.

7. The semiconductor device of claim 1, wherein the first protecting insulation layer comprises a material having a reflectivity of about 25% to about 35% in an Mine photolithography process.

8. The semiconductor device of claim 1, wherein the first protecting insulation layer comprises silicon oxynitride (SiON).

9. The semiconductor device of claim 1, wherein the substrate includes a bulk single crystalline silicon wafer, a silicon-on-insulator (SOI) wafer, a compound semiconductor wafer or a silicon epitaxial layer.

10. A semiconductor device, comprising:
a stack structure including a lower structure includes a lower substrate, a lower insulating interlayer disposed on the lower substrate, and a lower circuit disposed in the lower insulating interlayer, the lower circuit including a lower via pad, and an upper structure including an upper substrate, an upper insulating interlayer disposed on the upper substrate, and an upper circuit disposed in the upper insulating interlayer;
a via hole disposed to penetrate the stack structure to expose the lower via pad;
a first electrode including an electrode segment formed on a surface of the via hole;
a second electrode formed on the first electrode along the surface of the via hole, the second electrode including both ends positioned below a surface of the stack structure; and
a first protecting insulation layer formed on the second electrode along the surface of the via hole, the first protecting insulation layer including both ends upwardly protruding from the both ends of the second electrode.

11. The semiconductor device of claim 10, further comprising a second protecting insulation layer configured to cover the both ends of the second electrode exposed by the first electrode and the first protecting insulation layer.

12. The semiconductor device of claim 11, wherein the first protecting insulation layer and the second protecting insulation layer comprise different non-metal insulation materials.

13. The semiconductor device of claim 10, further comprising a capping layer configured to cover the stack structure and fill the via hole.

14. The semiconductor device of claim 10, wherein the both ends of the second electrode exposed by the first electrode and the first protecting insulation layer have a flat surface parallel to the surface of the substrate.

15. The semiconductor device of claim 10, wherein the first protecting insulation layer comprises a material having a reflectivity of about 25% to about 35% in an Mine photolithography process.

16. The semiconductor device of claim 10, wherein the first protecting insulation layer comprises silicon oxynitride (SiON).

17. The semiconductor device of claim 10, wherein the substrate includes a bulk single crystalline silicon wafer, a silicon-on-insulator (SOI) wafer, a compound semiconductor wafer or a silicon epitaxial layer.

18. A semiconductor device, comprising:
a substrate including a lower element and an upper element stacked on the lower element, the substrate including a via hole penetrating the substrate between the lower element and the upper element;
a first electrode formed along an inner surface of the via hole and an upper surface of the substrate;
a second electrode formed in the via hole, the second electrode being in contact with the first electrode disposed in the via hole; and
a first protecting insulation layer formed on the second electrode,
wherein the via hole includes a first height, the second electrode includes a second height lower than the first height, and the first protecting insulation layer includes a third height between the first height and the second height.

19. The semiconductor device of claim 18, further comprising a second protecting insulation layer formed on an exposed surface of the second electrode.

* * * * *